(12) United States Patent
Herrmann

(10) Patent No.: US 10,622,523 B2
(45) Date of Patent: Apr. 14, 2020

(54) LIGHT-EMITTING DIODE AND METHOD OF PRODUCING A LIGHT-EMITTING DIODE

(71) Applicant: OSRAM OLED GmbH, Regensburg (DE)

(72) Inventor: Siegfried Herrmann, Neukirchen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/737,999

(22) PCT Filed: Jun. 16, 2016

(86) PCT No.: PCT/EP2016/063917
§ 371 (c)(1),
(2) Date: Dec. 19, 2017

(87) PCT Pub. No.: WO2016/202934
PCT Pub. Date: Dec. 22, 2016

(65) Prior Publication Data
US 2018/0309030 A1 Oct. 25, 2018

(30) Foreign Application Priority Data

Jun. 19, 2015 (DE) .................. 10 2015 109 852

(51) Int. Cl.
*H01L 33/54* (2010.01)
*H01L 33/48* (2010.01)
*H01L 33/60* (2010.01)
*H01L 33/50* (2010.01)
*H01L 33/56* (2010.01)

(52) U.S. Cl.
CPC ............ *H01L 33/486* (2013.01); *H01L 33/50* (2013.01); *H01L 33/54* (2013.01); *H01L 33/56* (2013.01); *H01L 33/60* (2013.01)

(58) Field of Classification Search
CPC ....................................... H01L 33/54
See application file for complete search history.

(56) References Cited

U.S. PATENT DOCUMENTS 8,552,444 B2  10/2013  Ide et al.
8,896,199 B2  11/2014  Ito et al.
(Continued)

FOREIGN PATENT DOCUMENTS

CN   101855735 A   10/2010
CN   102916118 A    2/2013
(Continued)

*Primary Examiner* — Daniel Whalen
(74) *Attorney, Agent, or Firm* — DLA Piper LLP (US)

(57) ABSTRACT

A light-emitting diode includes an optoelectronic semiconductor chip that emits electromagnetic radiation through a radiation side along a main direction of emission running transversely to the radiation side during operation, the semiconductor chip is embedded in a solid body, wherein side surfaces and the radiation side are covered by the solid body in a form-fit manner, the solid body widens along the main direction of emission, a cover element is arranged downstream of the solid body in the main direction of emission and is applied directly onto the solid body, a side of a cover element facing away from the solid body is formed as a radiation exit surface of the light-emitting diode, and a first contact element is exposed in an unmounted and/or non-contacted state of the light-emitting diode.

17 Claims, 7 Drawing Sheets

(56) References Cited

U.S. PATENT DOCUMENTS

| | | |
|---|---|---|
| 9,099,615 B2 | 8/2015 | Tsutsumi et al. |
| 2006/0054913 A1 | 3/2006 | Hadame et al. |
| 2011/0309405 A1 | 12/2011 | Lee |
| 2013/0240930 A1 | 9/2013 | Akimoto et al. |
| 2014/0231850 A1* | 8/2014 | Tischler ................ H01L 33/508 257/98 |
| 2015/0091035 A1* | 4/2015 | Kim ........................ H01L 33/62 257/98 |
| 2015/0221623 A1* | 8/2015 | Tischler ................ H01L 25/165 257/89 |
| 2016/0087161 A1 | 3/2016 | Wirth et al. |
| 2016/0218261 A1 | 7/2016 | Moosburger et al. |
| 2017/0148966 A1 | 5/2017 | Schwarz et al. |

FOREIGN PATENT DOCUMENTS

| | | |
|---|---|---|
| CN | 103107265 A | 5/2013 |
| CN | 103531698 A | 1/2014 |
| DE | 10 2011 087 886 A1 | 6/2013 |
| DE | 10 2012 216 552 A1 | 3/2014 |
| DE | 10 2012 110 006 A1 | 4/2014 |
| DE | 10 2013 207 611 A1 | 10/2014 |
| DE | 10 2013 110 114 A1 | 4/2015 |
| WO | 2016/119973 A1 | 8/1916 |
| WO | 2016/131872 A1 | 8/1916 |
| WO | 2016/134981 A1 | 9/1916 |
| WO | 2016/156329 A1 | 10/1916 |
| WO | 2016/180732 A1 | 11/1916 |
| WO | 2016/180734 A1 | 11/1916 |
| WO | 2016/180810 A1 | 11/1916 |
| WO | 2016/180897 A1 | 11/1916 |

* cited by examiner

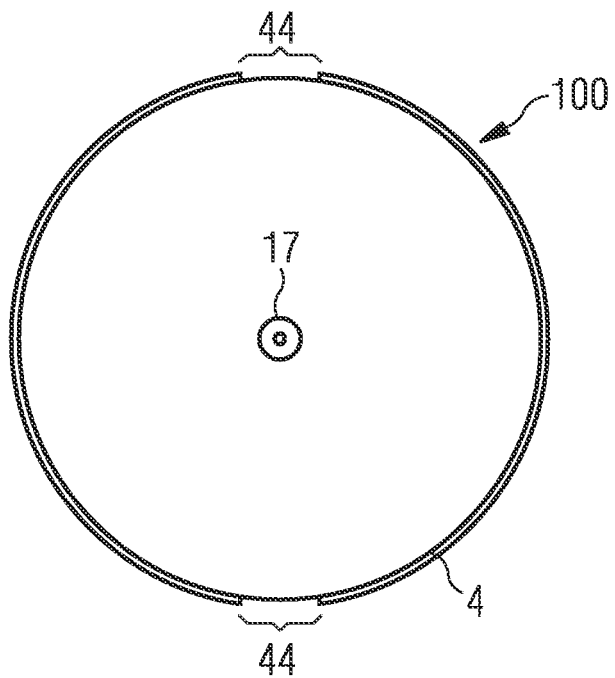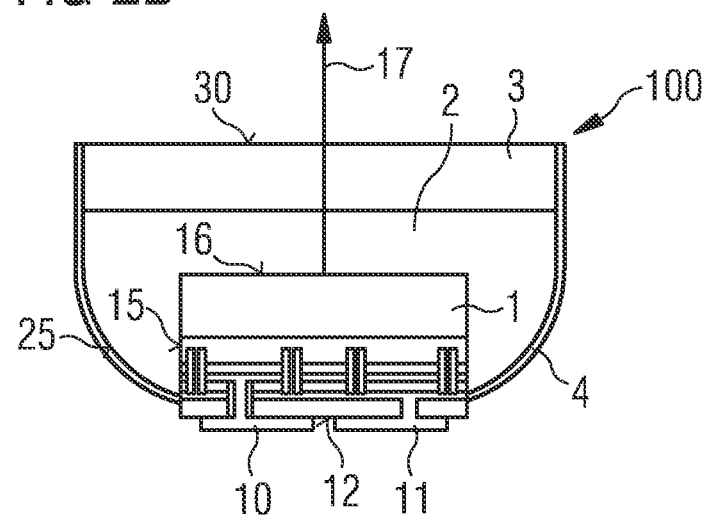

LIGHT-EMITTING DIODE AND METHOD OF PRODUCING A LIGHT-EMITTING DIODE

TECHNICAL FIELD

This disclosure relates to a light-emitting diode and a method of producing a light-emitting diode.

BACKGROUND

There is a need to provide a light-emitting diode particularly well protected from external impacts like moisture ingress, efficient in its radiation characteristic and radiation output, and a method of producing such a light-emitting diode.

SUMMARY

I provide a light-emitting diode including an optoelectronic semiconductor chip with a radiation side, a contact side located opposite the radiation side, and side surfaces extending transversely to the radiation side, wherein a first contact element is attached to the contact side for the external electrical contacting of the semiconductor chip, a transparent solid body, and a cover element, wherein the semiconductor chip emits electromagnetic radiation through the radiation side along a main direction of emission running transversely to the radiation side during operation, the semiconductor chip is embedded in the solid body, wherein the side surfaces and the radiation side are covered by the solid body in a form-fit manner, the solid body widens along the main direction of emission, the cover element is arranged downstream of the solid body in the main direction of emission and is applied directly onto the solid body, a side of the cover element facing away from the solid body is formed as a radiation exit surface of the light-emitting diode, and the first contact element is exposed in the unmounted and/or non-contacted state of the light-emitting diode.

I also provide a method of producing a plurality of light-emitting diodes including:
A) providing a carrier;
B) applying a transparent potting material onto the carrier;
C) providing a plurality of semiconductor chips, wherein each semiconductor chip includes a radiation side, a contact side opposite the radiation side, and side surfaces extending transversely to the radiation side, wherein the semiconductor chips emit electromagnetic radiation through the radiation side along a main direction of emission extending perpendicular to the radiation side during operation,
D) immersing the semiconductor chips with the radiation side face down so deeply into the potting material that the radiation side and the side surfaces are coated by the potting material in a form-fit manner, but the contact side still protrudes out of the potting material; and
E) singulating the semiconductor chips along separating planes through the potting material and the carrier so that individual light-emitting diodes result, wherein every light-emitting diode includes a solid body and a cover element, the cover element is each a part of the singulized carrier, the solid body is each a part of the singulized potting material, and the solid body becomes wider along the main direction of emission in each light-emitting diode.

I further provide a light-emitting diode including an optoelectronic semiconductor chip with a first contact element, a radiation side, a contact side located opposite the radiation side, and side surfaces extending transversely to the radiation side, wherein the first contact element is attached to the contact side for the external electrical contacting of the semiconductor chip, a transparent solid body, and a cover element, wherein the semiconductor chip emits electromagnetic radiation through the radiation side along a main direction of emission running transversely to the radiation side during operation, the semiconductor chip is embedded in the solid body, wherein the side surfaces and the radiation side are covered by the solid body in a form-fit manner, the solid body widens along the main direction of emission, the cover element is arranged downstream of the solid body in the main direction of emission and is applied directly onto the solid body, a side of the cover element facing away from the solid body is formed as a radiation exit surface of the light-emitting diode, the first contact element is exposed in the unmounted and/or non-contacted state of the light-emitting diode, and the cover element is a plate with two main sides essentially extending in parallel, wherein the main sides extend essentially parallel to the radiation side.

BRIEF DESCRIPTION OF THE DRAWINGS

FIGS. 2A to 2J show examples of various light-emitting diodes in lateral cross-sectional views.

LIST OF REFERENCE CHARACTERS

Figure 1A:
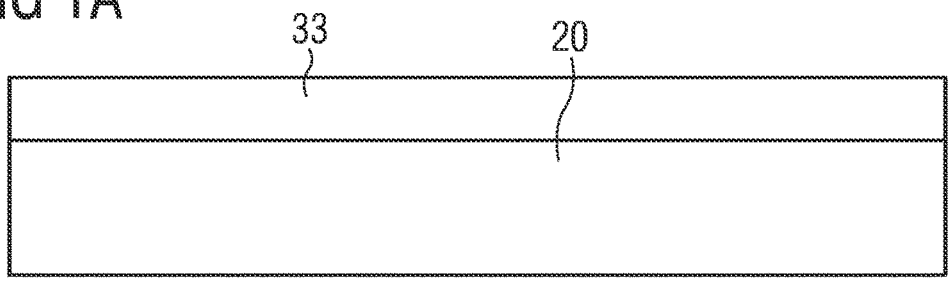
FIGS. 1A to 1F show various positions in the method of producing examples of light-emitting diodes.

1 Semiconductor chip
2 Molded body
3 Cover element
4 Mirror layer
4a Outer surface of mirror layer
5 Sacrificial layer
6 Housing body
10 First contact element
11 Second contact element
12 Contact side of semiconductor body 1
13 Growth substrate/auxiliary carrier
14 Semiconductor layer sequence
15 Side surface of semiconductor chip 1
16 Radiation side of semiconductor chip 1
17 Main emission direction
18 Converter element
20 Potting material
25 Shell surface of molded body 2
30 Radiation exit surface
33 Carrier
40 First passivation layer
41 Second passivation layer
44 Gap in mirror layer 4
50 Further molded body
100 Light-emitting diode

DETAILED DESCRIPTION

The light-emitting diode may comprise an optoelectronic semiconductor chip with a radiation side and a contact side located opposite the radiation side. The radiation side and/or the contact side form e.g. main sides, i.e. sides with the greatest lateral extent of the semiconductor chip. Furthermore, the semiconductor chip comprises side surfaces extending transversely to the contact side or radiation side that connect the contact side and radiation side to one another. A first contact element for the external electrical contacting of the semiconductor chip is attached to the contact side of the semiconductor chip. The first contact element comprises e.g. a metal or consists thereof.

The semiconductor chip can comprise an auxiliary carrier onto which a semiconductor layer sequence is applied. The auxiliary carrier can form the stabilizing component of the semiconductor chip so that the semiconductor chip is self-supporting and mechanically stable. Further stabilization measures besides the auxiliary carrier are therefore not necessary. The auxiliary carrier can be a growth substrate for the semiconductor layer sequence. Alternatively, the auxiliary carrier can also be different from a growth substrate, in this case the growth substrate can be removed. The auxiliary carrier is based, for example, on Si, SiC, Ge, sapphire, GaN, GaAs, a plastic, a semiconductor material, or a metal.

The semiconductor sequence is based on a III-V-compound semiconductor material, for example. In this case, the semiconductor material is, for example, a nitride compound semiconductor material such as $Al_nIn_{1-n-m}Ga_mN$, or a phosphide compound semiconductor material such as $Al_nIn_{1-n-m}Ga_mP$, or also an arsenide compound semiconductor material such as $Al_nIn_{1-n-m}Ga_mAs$, with $0 \le n \le 1$, $0 \le m \le 1$, and $m+n \le 1$, respectively. The semiconductor layer sequence can comprise dopants as well as additional constituents. For the sake of simplicity, however, only the essential constituents of the crystal lattice, that is Al, As, Ga, In, N, or P are indicated, even when these can be partially replaced or supplemented by small amounts of further substances. The semiconductor layer sequence is preferably based on AlInGaN or AlInGaAs.

The semiconductor chip may be configured to produce electromagnetic radiation and emit it via the radiation side along a main direction of emission extending transversely or perpendicular to the radiation side during operation. The main direction of emission is directed, for example, from the contact side through the radiation side out of the semiconductor chip.

For example, the semiconductor layer sequence can comprise an active layer that generates radiation. The active layer contains in particular at least one pn junction and/or a quantum well structure in the form of a single quantum well, SQW for short, or in the form of a multi quantum well structure, MQW for short.

During operation, the active layer generates radiation in the blue spectral range and/or in the ultraviolet spectral range or in the visible spectral range, for example.

The light-emitting diode may comprise a transparent, in particular clear-sighted solid body. The solid body is preferably formed solidly and/or in one piece.

The light-emitting diode may comprise a cover element, wherein the cover element can comprise or consist of one or more of the following materials, for example: glass, silicone, in particular clear silicone, plastic, converter material. The cover element can in particular be transparent and/or clear-sighted for the radiation emitted by the semiconductor chip. Alternatively or additionally, the cover element can partially or completely absorb the radiation of the semiconductor chip, and convert it into radiation of a different wavelength range. The at least partially converted radiation emerging from the cover element can then, for example, be light in the visible range, in particular white light.

The semiconductor chip may be embedded in the solid body, wherein the side surfaces and the radiation side are covered by the solid body in a form-fit manner. In particular, the solid body is in direct contact with the semiconductor chip and encloses the semiconductor chip. The side surfaces and/or the radiation side can in each case be covered entirely or partially, for example, by at least 60% or 80% or 90%, by the solid body.

The solid body and/or the semiconductor chip are then, for example, the stabilizing components of the light-emitting diode so that the light-emitting diode is mechanically self-supporting. Further stabilization measures, for example, an additional carrier for the light-emitting diode, are then not necessary for stabilization.

The solid body may widen along the main emission direction. The solid body can widen continuously and/or steadily and/or monotonously. Steps in the solid body are also possible. For example, the solid body has an aspheric geometry, for example, the form of an ellipsoid segment. A spherical geometry is also possible, however, for example, the geometry of a spherical segment, or the geometry of a truncated cone or a truncated pyramid.

Preferably, the semiconductor chip is arranged in the center or in the middle in the solid body so that an axis of symmetry of the solid body extending parallel to the main direction of emission coincides with an axis of symmetry of the semiconductor chip.

The widening shape of the solid body can serve in particular to expand a light beam emerging from the radiation side.

The cover element may be arranged downstream of the solid body in the main direction of emission and is directly applied onto the solid body. Radiation emitted from the semiconductor chip in the direction of the main direction of emission therefore first passes through the solid body and then impinges the cover element, through which the radiation is decoupled from the light-emitting diode.

A side of the cover element facing away from the solid body may be formed as the radiation exit surface of the light-emitting diode. At least a part, for example, a major part such as at least 50% or 80% or 90% or 99% of the radiation emitted from the semiconductor chip is then decoupled from the light-emitting diode through the radiation exit surface.

The first contact element may be exposed in an unmounted and/or electrically non-contacted state of the light-emitting diode. The light-emitting diode can then, for example, be suitable to be applied, for example, soldered with the contact side face down onto a carrier such as a contact carrier, wherein the first contact element electrically-conductively connects to the carrier.

The light-emitting diode may comprise an optoelectronic semiconductor chip with a radiation side, a contact side opposite of the radiation side and side surfaces extending transversely to the radiation side, wherein a first contact element for the external electrical contacting of the semiconductor chip is attached onto the contact side. Furthermore, the light-emitting diode comprises a transparent solid body as well as a cover element. During operation, the semiconductor chip emits electromagnetic radiation through the radiation side along a main direction of emission extending transversely to the radiation side. The semiconductor chip is embedded in the solid body, wherein the side surfaces and the radiation side are covered by the solid body in a form-fit manner. The solid body widens along the main direction of emission. The cover element is arranged downstream of the solid body in the main direction of emission and directly applied onto the solid body. A side of the cover element opposite of the solid body is formed as a radiation exit surface of the light-emitting diode. The first contact element is exposed in the unmounted and/or electrically non-contacted state of the light-emitting diode.

My light-emitting diodes and methods described herein are in particular underlying the knowledge, that semiconductor chips are often times impaired by external impacts such as moisture ingress and, therefore, are subjected to faster ageing. Due to the use of a solid body having the semiconductor chip encapsulated therein in a form-fit manner, such impacts can be reduced. The specific geometry of the solid body widening in the direction away from the radiation side has a positive effect on the emission output or the emission characteristic of the light-emitting diode. This way, in particular, an expansion of an emitted beam bundle can result. Furthermore, the widening geometry of the molded body can have a beam-directing effect. The radiation emitted by the semiconductor chip is in part totally reflected on the shell surfaces or outer surfaces and therefore directed towards the cover element.

Furthermore, the encapsulating effect of the molded body comes with the advantage that, also, sensitive converter materials such as quantum dots can be used as converter materials within the molded body or the semiconductor chip.

The solid body may comprise one or multiple shell surfaces extending transversely to the radiation side. The shell surfaces are outer surfaces of the molded body. The shell surfaces are exposed toward the outside, i.e. are not covered by further elements of the light-emitting diode and form outer surfaces of the light-emitting diode. In the mounted or unmounted state of the light-emitting diode, the shell surfaces are, for example, completely surrounded by a gas such as air. The high refractive index difference between the material of the molded body and the material surrounding the molded body results in a high level of total reflection inside the molded body.

As an alternative, however, it is also possible for the shell surfaces of the molded body to have a coating applied thereon, the thickness of which is at most 20 µm or 10 µm or 5 µm or for example. In this case, the coating preferably forms outer surfaces of the light-emitting diode. The coating is then completely surrounded by a gas on the outside such as air, for example, and not covered by further elements of the light-emitting diode. The coating can in particular comprise or consist of a mirror layer and/or a first passivation layer and/or a second passivation layer.

One or multiple or all shell surfaces of the molded body may be coated by a mirror layer. The mirror layer can be applied directly or indirectly onto the shell surfaces. In particular, also a further layer such as a passivation layer can be arranged between the mirror layer and the shell surfaces. The mirror layer can cover the shell surfaces partially or completely.

The degree of coverage of the mirror layer on the shell surfaces is at least 80% or 90% or 99%, for example. The mirror layer can comprise or consist of one or multiple metals such as silver or aluminum or platinum or gold or titanium. The thickness of the mirror layer is at least 100 nm or 500 nm or 1 µm, for example. As an alternative or in addition, the thickness of the mirror layer is at most 10 µm or 5 µm or 2 µm. The mirror layer may also be a multilayer mirror such as a Bragg mirror, for example.

The mirror layer may have a reflectivity of at least 80% or 90% or 95% for the radiation emitted by the semiconductor chip. The reflectivity is e.g. the averaged reflectivity measured over the emission spectrum of the semiconductor chips or a reflectivity measured at the wavelength at which the semiconductor chip has an emission maximum.

The solid body may comprise or consist of one or more of the following materials: plastic materials such as thermoplastics or thermosetting plastics, silicone such as clear silicone, resin, silicone resins, silazane, acryl, parylene, Omocer, glass.

The solid body may hermetically encapsulate the semiconductor chip. Hermetically in this case means that the molded body partially or completely prevents gases or liquids from leaking or entering and therefore protects the semiconductor chip from external impacts.

The molded body may be surrounded by a housing body in the lateral direction, in particular completely and/or in a form-fit manner. The housing body can be a potting material. The housing body is in direct contact with the solid body or with a coating applied onto the solid body, for example. The housing body can be transparent or impermeable for radiation emitted by the light-emitting diode. The housing body can, for example, suppress or prevent radiation from laterally exiting the light-emitting diode, possibly together with the mirror layer. The housing body comprises or consists of a plastic material such as a white plastic material, or a silicone or a resin or a silicon resin, for example. Radiation-reflecting particles such as $TiO_2$ particles can be embedded in the material of the housing body.

The solid body and the mirror layer may have a first passivation layer arranged between them. The first passivation layer can in particular comprise or consist of one or multiple transparent materials. Silicon oxides such as $SiO_2$, or aluminum oxides such as $Al_2O_3$ or siloxanes such as Hexamethyldisiloxane, HMDSO, or ZNO can be used. The first passivation layer can in particular serve as an adhesive layer between the mirror layer and the molded body.

The first passivation layer may have a thermal expansion coefficient of −20° C. to +100° C., this coefficient ranging between the respective thermal expansion coefficient of the solid body and the respective thermal expansion coefficient of the mirror layer. In temperature changes, the first passivation layer can partially compensate or balance different expansions of the mirror layer and the solid body and therefore reduce stress inside the light-emitting diode. This also improves the service life of the light-emitting diode.

A second passivation layer may be applied onto outer sides of the mirror layer. The second passivation layer can serve as a protection of the mirror layer. The second passivation layer comprises or consists of a silicon nitride such as SiN, or a silicon oxide such as $SiO_2$, or parylene or alumina such as $Al_2O_3$ or HDMSO.

The thicknesses of the first and second passivation layers are each 50 nm to 5 µm, for example.

The contact side may have a second contact element attached thereon for external electrical contacting of the semiconductor chip. The second contact element can also comprise or consist of a metal and/or be exposed in the unmounted or electrically non-contacted state of the light-emitting diode. The semiconductor chip or the light-emitting diode can in particular completely be electrically contacted or supplied with current via the first contact element and the second contact element.

The mirror layer may be guided as far as onto the contact side of the semiconductor chip and electrically-conductively connected to the first contact element. Preferably, the mirror layer is formed of an electrically-conductive material such as a metal, or comprises such a material. The mirror layer is in particular in direct contact with the first contact element or forms the first contact element.

The mirror layer may be guided as far as onto the contact side and electrically-conductively connected to the second contact element. The mirror layer can directly be applied onto the second contact element or can form the second contact element.

The mirror layer may be interrupted alongside a gap so that no short-circuit occurs between the first and second contact elements during operation. In other words, the mirror layer is not formed contiguously but comprises two regions electrically insulated from one another and e.g. electrically-conductively connected to the first and the second contact element, respectively. The gap of the mirror layer has a width of at most 10 μm or 5 μm or 3 μm and/or of at least 500 nm or 1 μm or 3 μm.

The mirror layer may electrically-conductively connect to the second contact element and extend over the entire contact side. In a plan view of the contact side, the contact side is completely covered by the mirror layer.

The first contact element and the second contact element may be located one on top of the other so that in the region of the contact side the second contact element is arranged between the semiconductor chip and the first contact element. Preferably, an insulating layer, for example, of silicon oxide is arranged between the first and the second contact element, the insulating layer electrically insulates the two contact elements from one another.

The first contact element may form a further mirror that may cover the semiconductor chip in part completely in a top view of the rear side of the semiconductor chip. The further mirror can have similar or identical properties as the mirror layer mentioned above, in particular with respect to the reflectivity, the material and the thickness.

Side surfaces of the cover element running transversely to the radiation exit surfaces and the shell surfaces of the solid body may be completely coated by the mirror layer.

The cover element may be configured as a plate having two main sides substantially running in parallel. The main sides can extend substantially parallel to the radiation side of the semiconductor chip. The thickness of the cover element between the two main sides is e.g. 5 mm or 1 mm or 500 μm at most. Alternatively, or in addition, the thickness of the cover element is at least 100 μm or 200 μm or 300 μm.

The cover element may have the geometrical shape of a lens. The cover element can be planoconvex or planoconcave, for example. In particular, the cover element is configured as a Fresnel lens. Preferably, the radiation exit surface of the cover element is partially or completely convexly or concavely curved.

The cover element may be a tube filled with quantum dots. The quantum dots are, for example, configured to cause a conversion of the radiation emitted by the semiconductor chip. Thus, in this case, the cover element is in particular configured as a converter element. A longitudinal axis of the tube extends essentially parallel to the radiation side here.

The light-emitting diode may comprise one or more semiconductor chips each embedded in a molded body as described above, and mechanically connected to one another by a common cover element.

The semiconductor chip may have a converter element applied onto the semiconductor layer sequence besides the semiconductor layer sequence. The converter element is arranged downstream of the semiconductor layer sequence, in particular in the main emission direction, and preferably forms the radiation surface of the semiconductor chip. In this case, the converter element may comprise quantum dots for radiation conversion, for example, wherein the sensitive quantum dots are protected against external impacts by the molded body. Alternatively or in addition, it is also possible for the converter element of the semiconductor chip to be a ceramic converter element or a potting provided with converter particles such as a silicone potting.

The lateral dimensions of the light-emitting diode parallel to the radiation side may be greater than the lateral dimensions of the semiconductor chips by at least 300 μm or 500 μm or 1 mm. Alternatively or in addition, the lateral dimensions of the light-emitting diode are larger than those of the semiconductor chip by at most 10 mm or 5 mm or 1 mm. The vertical dimensions of the light-emitting diode are e.g. larger than the vertical dimensions of the semiconductor chip by at least 100 μm or 200 μm or 500 μm and/or by at most 1 mm or 700 μm or 500 μm, with the vertical direction being a direction parallel to the main emission direction of the semiconductor chip.

I also provide a method of producing a plurality of light-emitting diodes. The method is in particular suitable for the production of the light-emitting diodes described herein. In other words, all features disclosed in conjunction with the light-emitting diode are also disclosed for the method and vice versa.

The method of producing a plurality of light-emitting diodes may comprise a step A), in which a carrier is provided. The carrier can comprise or consist of the same materials as mentioned in conjunction with the above-mentioned cover element. It is also possible for the carrier to be a converter element, a ceramic converter element, for example.

In a step B), a transparent potting material is applied onto the carrier. The transparent potting material can comprise or consist of the same materials as mentioned in conjunction with the above-mentioned molded body.

In a further method step C), a multitude of semiconductor chips are provided, wherein each semiconductor chip comprises a radiation side, a contact side located opposite the radiation side, and side surfaces extending transversely to the radiation side. The semiconductor chips are in particular configured to emit electromagnetic radiation via the radiation side along a main emission direction running perpendicular to the radiation side during operation.

In a step D), the semiconductor chips are immersed into the potting material with the radiation side face down so deep that the radiation side and the side surfaces are partially or completely covered by the potting material in a form-fit manner. The contact side can still project out of the potting material even after immersion. The potting material can then subsequently be cured.

In a method step E), the semiconductor chips are singulized along separating planes through the potting material and the carrier so that individual light-emitting diodes are produced. The light-emitting diodes each comprise a solid body and a, e.g. exactly one, cover element. The cover element forms part of the singulized carrier, the solid body forms part of the singulized potting material. In each of the light-emitting diodes, the semiconductor body is designed such that it widens along the main emission direction. In particular, each light-emitting diode comprises one, e.g. exactly one, semiconductor chip.

The above-mentioned steps A) to E) may be performed independently of one another as separate steps. The steps are preferably executed in the specified order.

The potting material may have a viscosity of $10^5$ P·s or $10^4$ P·s or $10^3$ P·s at most upon immersion of the semiconductor chip. As an alternative or in addition, the viscosity of the potting material is at least $10^2$ P·s or $10^3$ P·s or $10^4$ P·s.

The material of the potting material may be selected to change its shape in the region of the semiconductor chip upon immersion or in a curing process following the immersion due to surface tensions. Alteration of the shape is such that the widening shape of the later solid body is formed automatically. In this case, the widening shape of the solid bodies does not have to be formed in an additional method step, e.g. in a removal or patterning process, the shape of the solid bodies is rather formed automatically due to the material properties of the potting material.

As an alternative, it is also possible for the potting material to be structured or mechanically machined prior to or after curing, e.g. being grinded or removed or formed into a desired shape through a shaping process in the un-cured state.

A mirror layer may be deposited onto the potting material from a side facing away from the carrier after step D). Deposition of the mirror layer can e.g. be effected by a sputtering process or vaporization or physical vapor deposition, PVD for short, or chemical vapor deposition, CVD for short, or atomic layer deposition, ALD for short.

A sacrificial layer may be applied at least onto the contact side prior to deposition of the mirror layer. The sacrificial layer can be a photoresist or a plastic, for example. The sacrificial layer can be attached such that it partially or completely covers the contact side.

After deposition of the mirror layer, the sacrificial layer is then removed again such that the regions previously covered by the sacrificial layer are free from the mirror layer. In this way, it can be prevented that contact elements attached to the contact side are coated by the mirror layer or come into contact with the mirror layer. In this way, a gap can be formed in the mirror layer so that the mirror layer is not of contiguous design thereafter.

A light-emitting diode described herein as well as a method of producing a multitude of light-emitting diodes is explained in greater detail hereinafter with reference to the drawings by examples. Like reference characters indicate like elements throughout the individual figures. However, relations are not made true to scale and individual elements can rather be illustrated in an exaggerated size for the purpose of a better understanding.

FIG. 1A shows a position in the production method. A carrier 33 is provided having a potting material 20 applied thereon. The carrier 33 is e.g. a glass carrier or a plastic carrier or a converter element. The potting material 20 is e.g. a liquid or viscous, in particular transparent plastic material or a clear silicone with a viscosity of between $10^3$ P·s and $10^5$ P·s. The potting material 20 and the carrier 33 can be connected to one another by a connecting substance. The connecting substance can in particular contain particles of a conversion substance configured to convert electromagnetic radiation generated during operation of the optoelectronic component of one wavelength range into electromagnetic radiation of a different wavelength range. As an alternative to the illustrated example, the potting material 20 can be provided on the carrier in the form of multiple drops. The surface of each drop facing away from the carrier 30 is formed spherically or parabolically, for example.

Moreover, two optoelectronic semiconductor chips are provided in FIG. 1A, each comprising a contact side 12 opposite the radiation side as well as side surfaces 15 extending transversely to the radiation side 16. A further specified description of the structure of the semiconductor chip 1 is given in conjunction with FIGS. 3A and 3B.

The semiconductor chips 1 are configured to emit electromagnetic radiation during operation, e.g. in the blue or ultraviolet or visible range. At least a part, e.g. at least 80% is emitted via the radiation side 16 out of the semiconductor chip 1. The contact sides 12 of the semiconductor chips 1 each have a first metal contact element 10 and a second metal contact element 11 applied thereon, via which the semiconductor chips 1 can be externally electrically contacted. The contact elements 10, 11 are exposed on the contact side, i.e. are freely accessible from outside.

Figure 1B:
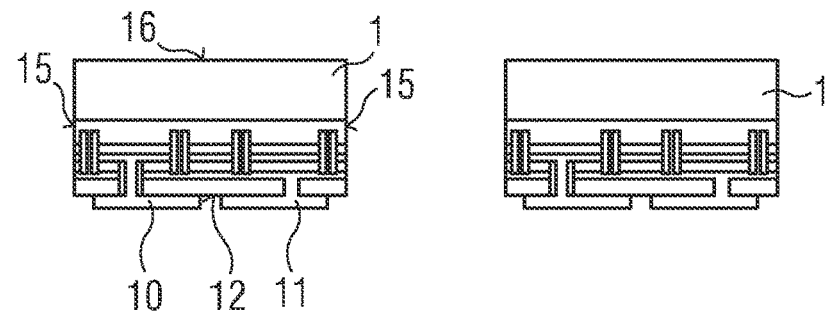

FIG. 1B shows a position in the method in which the semiconductor chips 2 are pressed into the potting material 20 with the radiation side 16 face-down. The material of the potting material 20 is selected such that during pressing or due to a curing process, it is drawn alongside the side surfaces 12 toward the contact side as a result of surface tensions, and thereby covers the side surfaces 15. In this case, after immersion of the semiconductor chip 1 or after curing, the side surfaces 15 are covered with the potting material 20 by at least 80%. The potting material 20 encloses the radiation sides 16 and side surfaces 15 in a form-fit manner and directly electrically contacts the semiconductor chip 1. If the potting material is provided on the carrier 33 in the form of multiple droplets, each drop of the potting material 20 has exactly one semiconductor chip 1 arranged therein.

Through the wetting of the side surfaces 15 with the potting material 20, the potting material 20 has a shape widening in the direction away from the contact side and towards the radiation side. Furthermore, it can be seen from FIG. 1B that the contact sides 12 with the contact elements 10, 11 remain free from the potting material 20, i.e. are still freely accessible from the outside.

Figure 1C:
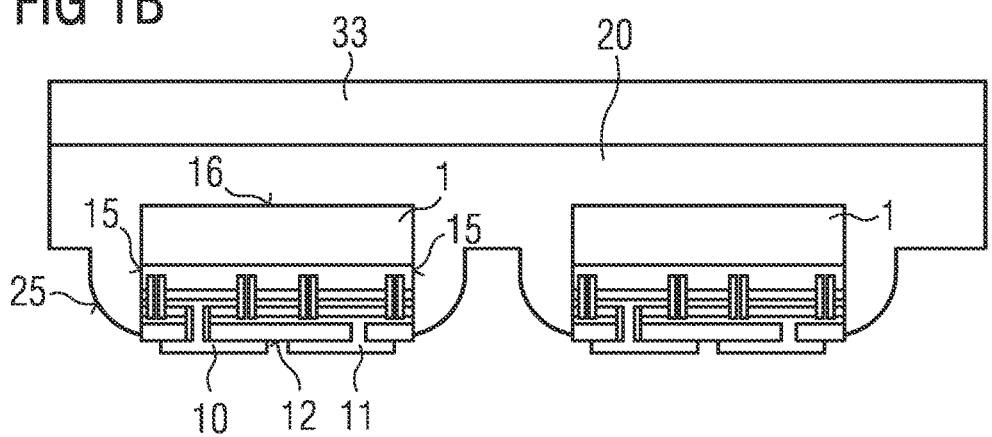

FIG. 1C shows another position in the production method in which, in each case, a sacrificial layer 5 is applied onto the contact sides 12 of the semiconductor chips 1. The sacrificial layers 5 completely cover the contact sides 12. The sacrificial layers 5 are based on a photoresist or a plastic material, for example.

Furthermore, the sacrificial layers 5 and the potting material 20 have a mirror layer 4 applied thereon from a side facing away from the carrier 33. The mirror layer 4 is formed of a metal, e.g. silver, and has a thickness of 500 nm to 2 µm. Applying the mirror layer 4 onto the potting material 20 and the sacrificial layers 5 can take place by a sputtering process or vapor deposition, for example. It can be taken from FIG. 1C that the mirror layer 4 completely covers all sides of the sacrificial layers 5 and of the potting material 20 previously exposed. In particular, shell surfaces 25 of the potting material 20 running transversely to the radiation side 16 are also covered by the mirror layer 4.

Figure 1D:
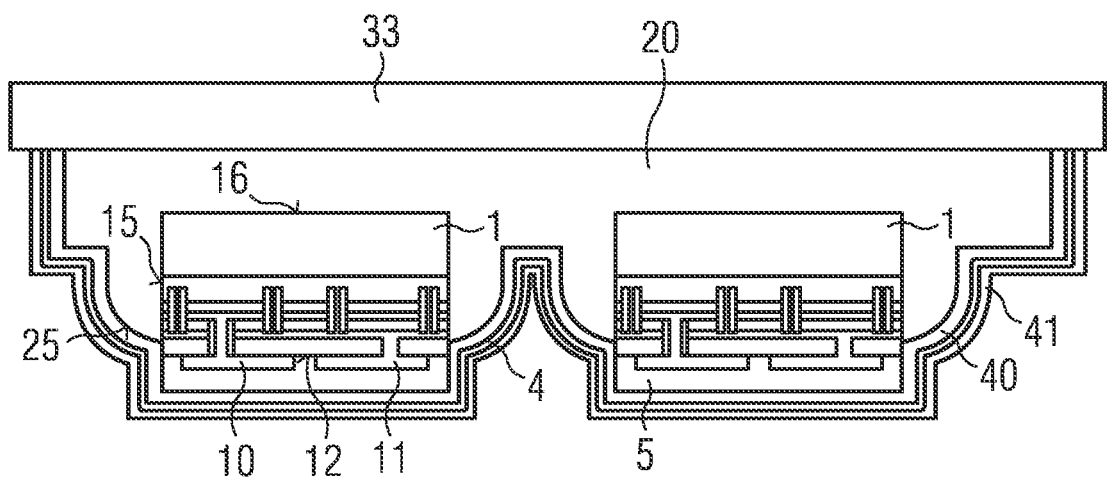

FIG. 1D shows another possible position in the production method. In contrast to FIG. 1C, the mirror layer 4 is not applied directly onto the potting material 20, rather the mirror layer 4 and the potting material 20 have a first passivation layer 40 arranged therebetween. The first passivation layer 40 is based on silicon oxide, for example. Advantageously, the materials of the potting material 20, the mirror layer 4 and the first passivation layer 40 are selected such that the thermal expansion coefficient of the first passivation layer 40 is between the thermal expansion coefficients of the potting material 20 and the mirror layer 4 at a temperature of −20° C. to +100° C.

Furthermore, it can be discerned that a second passivation layer 41, e.g. also based on silicon oxide or silicon nitride, is applied onto outer sides of the mirror layer 4. The second passivation layer 41 protects the mirror layer 4 against external impacts.

Figure 1E:
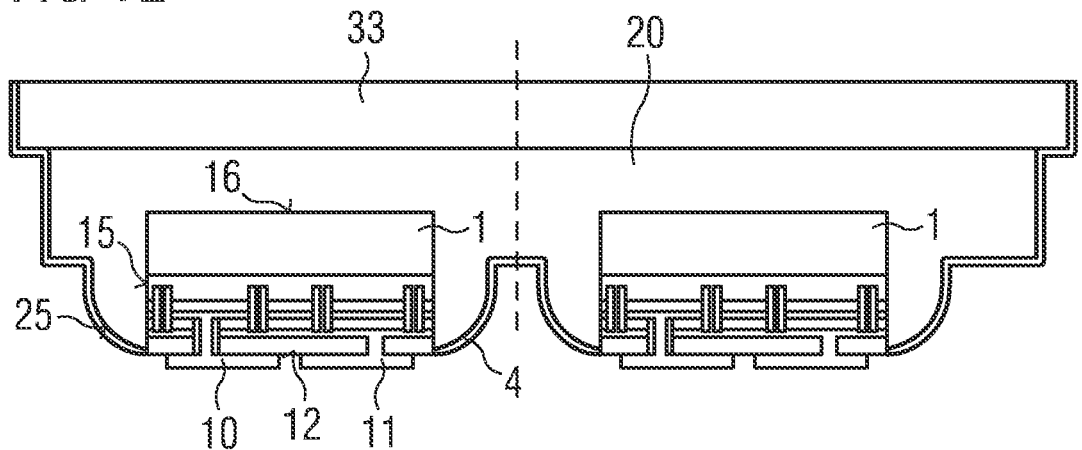
Figure 1F:
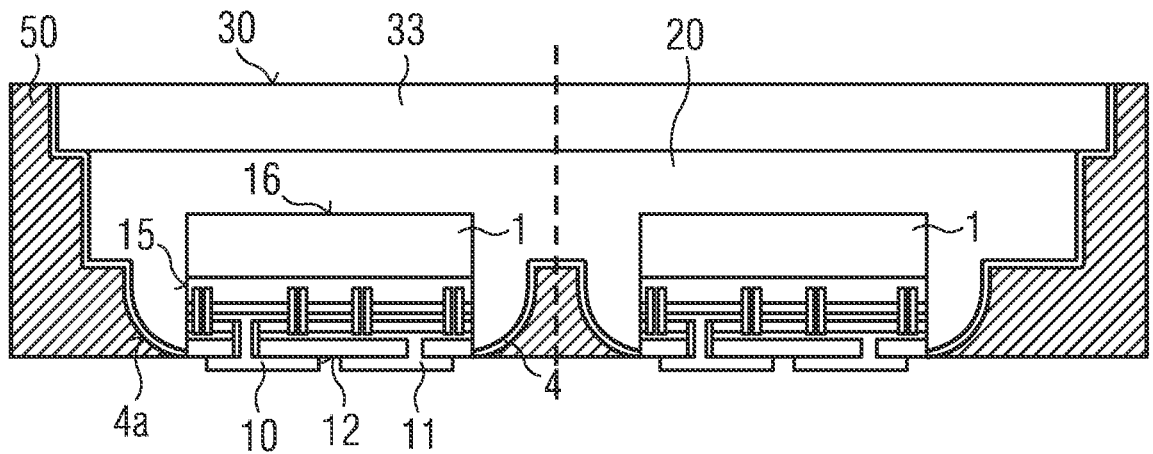

FIG. 1E shows a position that follows the position of FIG. 1C in the production method. The sacrificial layers 5 are detached from the contact sides 12 of the semiconductor chips 1 with their mirror layer 4 applied thereon. After detachment of the sacrificial layers 5, the contact sides 12 as well as the contact elements 10, 11 applied thereon are exposed, i.e. are freely accessible from the outside. However, the potting material 20 is still covered with the mirror layer 4.

Furthermore, FIG. 1E indicates a method step in which the semiconductor chips 1 are singulized through the potting material 20 and the carrier 33 along a separating plane indicated as a dashed line such that individual light-emitting diodes 100 are achieved.

According to an alternative example of the production method, a further molded body 50 can be arranged on the outer surface 4a of the mirror layer 4 before singulating the semiconductor chips. The contact elements 10, 11 and the radiation exit surface 30 are free of the further molded body 50.

Figure 2A:
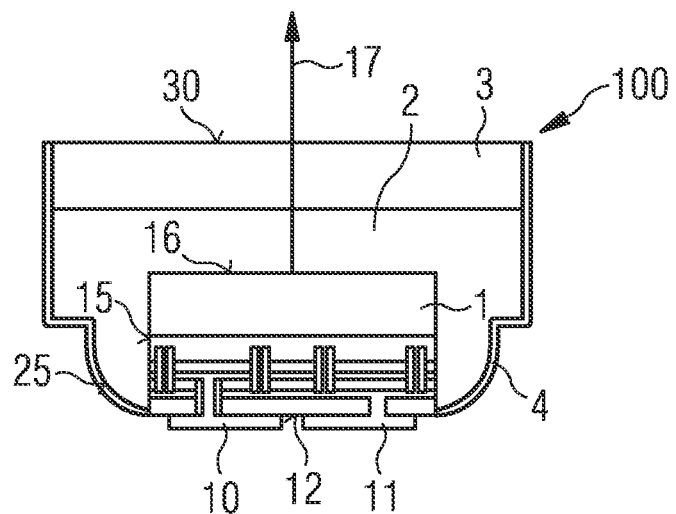

The example of FIG. 2A shows a light-emitting diode 100, which is e.g. at least in part produced with the method described in conjunction with FIGS. 1A to 1F. The light-emitting diode 100 comprises an already-described semiconductor chip 1. FIG. 2A also indicates that the semiconductor chip 1 emits radiation along a main emission direction 17 leading away from the radiation side 16.

The semiconductor chip 1 is embedded in a molded body 2, wherein the molded body 2 encloses both the side surfaces 15 and the radiation side 16 of the semiconductor chip 1 in a form-fit manner and directly contacts the semiconductor chip 1. Furthermore, the molded body 2 widens in the direction away from the contact side 12 along the main emission direction 17. The molded body 2 widens monotonously, i.e. there are no regions in which the molded body 2 becomes narrower again in the direction of the main emission direction 17. Consequently, the widest place of the molded body 2 is the place located farthest away from the contact side.

The molded body 2 has a cover element 3 arranged downstream constituting a part of the carrier 33 described above. The cover element 3 directly contacts the molded body 2 and terminates flush with the molded body 2 in the lateral direction. In this case, the cover element 3 is formed as a plate having two main sides essentially running in parallel. A main side of the cover element 3 facing away from the molded body 2 is formed as a radiation exit surface 30 of the light-emitting diode 100, via which at least 90% of the radiation generated is decoupled from the light-emitting diode 100 during operation.

Furthermore, it can be discerned in the example of FIG. 2A that shell surfaces 25 or outer surfaces 25 of the molded body 2 extending transversely to the main emission direction are completely covered with the mirror layer 4. Side surfaces of the cover elements 3 that extend transversely to the radiation side 16 are also completely covered by the mirror layer 4.

The lateral dimensions of the light-emitting diode 100 are e.g. larger than the lateral dimensions of the semiconductor chip 1 by at least 300 μm.

Figure 2B:
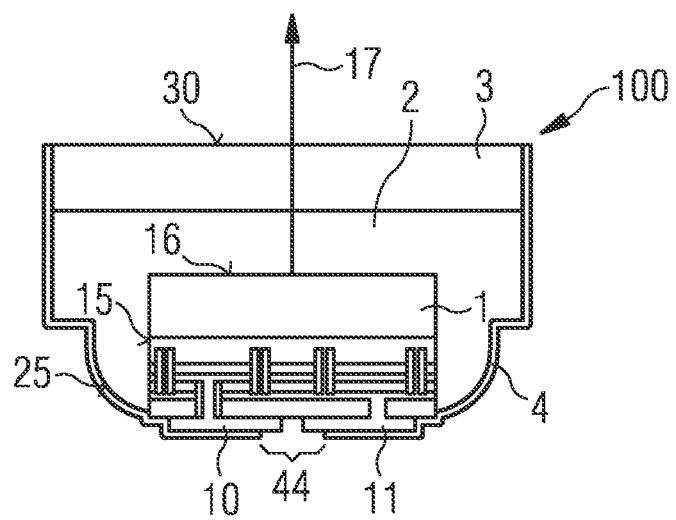

FIG. 2B shows an example of a light-emitting diode 100 in which the mirror layer 4 is drawn down as far as onto the contact side 12 of the semiconductor chip 1, and thereby is in direct mechanical and electrical contact both with the first contact element 10 and the second contact element 11. In contrast to what is shown, the mirror layer 4 could per se form the contact elements 10, 11. The mirror layer 4 is interrupted along a gap 44 so that no short circuit occurs between the contact elements 10, 11.

FIG. 2C shows the example of FIG. 2B in a top view of the radiation exit surface 30. It can be discerned here that the gap 44 extends through the entire mirror layer 4 so that the mirror layer 4 is not formed contiguously, but consists of two sub-regions.

The example of FIG. 2D shows a light-emitting diode 100 essentially corresponding to the light-emitting diode 100 of FIG. 2A. In contrast to FIG. 2A, the molded body 2 widens continuously and/or steadily in the direction away from the contact side 12 and, in contrast to FIG. 2A, does not have any cracks or discontinuous regions within the molded body 2. In a 3D-illustration, the molded body 2 has a spherical or aspherical shape, e.g. an ellipsoid segment or a spherical segment.

Figure 2E:
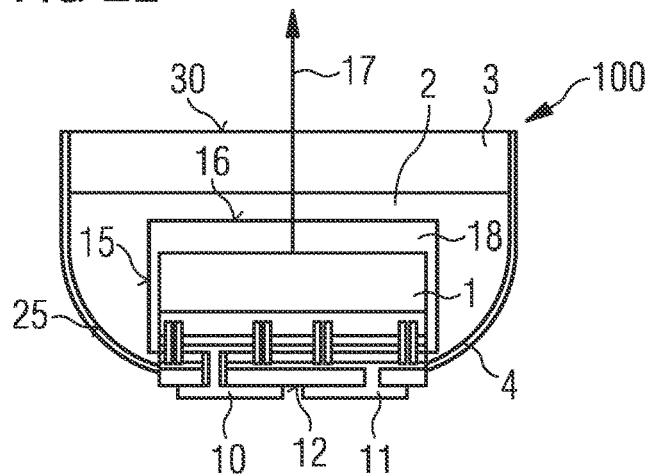

The example of a light-emitting diode 100 of FIG. 2E is different from the example of FIG. 2D only with respect to the semiconductor chip 1. In FIG. 2E, the semiconductor chip 1 comprises a converter element 18, which forms the radiation side 16. The converter element 18 can be a ceramic converter element or a potting provided with converter particles. It is also possible for the converter element 18 to comprise quantum dots as converter particles, which are particularly well protected against outer impacts by the molded body 2.

Figure 2F:
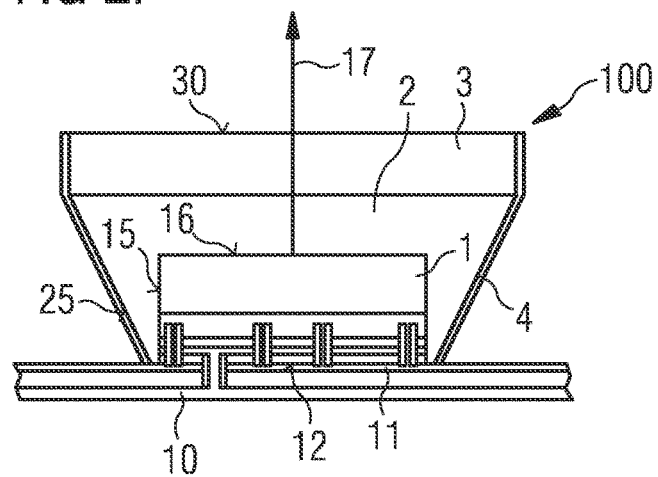

In the example of a light-emitting diode 100 of FIG. 2F, the molded body 2 is formed in a trapezoidal shape in a cross-sectional view. In a 3D-illustration, the molded body 2 could be a truncated cone or a truncated pyramid, for example.

Furthermore, in FIG. 2F, the second contact element 11 is formed by the mirror layer 4 extending over almost the entire contact side 12 of the semiconductor chip 1. Radiation emitted by the semiconductor chip 1 in the direction of the contact side 12 can then be reflected in the direction toward the radiation side via the second contact element 11.

The first contact element 10 is arranged on the second contact element 11 and also covers the entire contact side 12 of the semiconductor chip 1. The first contact element 10 is preferably a further mirror. The second contact element 11 is arranged between the semiconductor chip 1 and the first contact element 10 and electrically insulated from the first contact element 10 by an insulating layer. The electrical connection of the semiconductor chip 1 with the first contact element 10 is effected by a through-connection through the insulation layer and the second contact element 11.

Figure 2G:
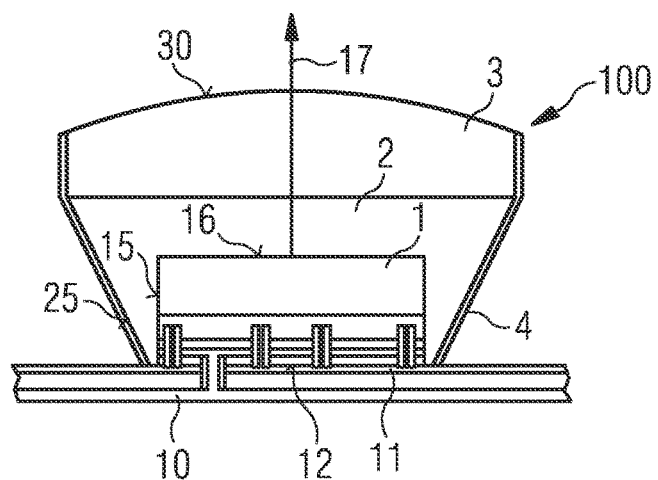

The example of FIG. 2G shows a light-emitting diode essentially corresponding to the light-emitting diode of FIG. 2F. In contrast to FIG. 2F, the cover element 3, however, is no longer formed as a plate but as a lens having a curved radiation exit surface 30. The cover element 3 can thus have a bundling or focusing effect for the radiation emitted by the semiconductor chip 1.

Figure 2H:
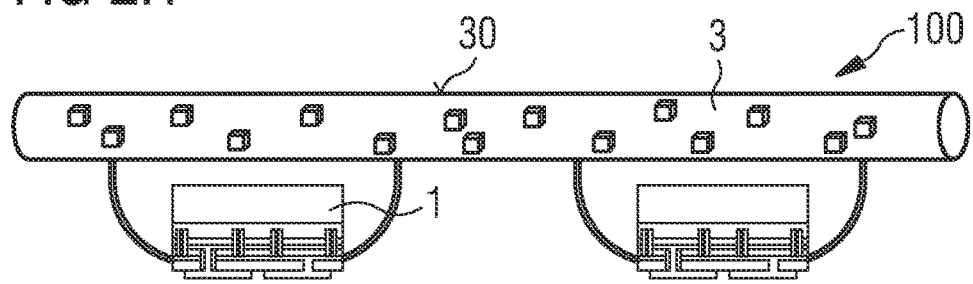

FIG. 2H shows an example of a light-emitting diode 100 in which the cover element is formed as a tube having quantum dots embedded therein. The tube is hermetically sealed towards the outside so that the quantum dots are protected inside the tube against external impacts, for example. The tube has two semiconductor chips 1 as described above with corresponding molded bodies 2 arranged on the shell surface thereof. The radiation exit surface 30 of the cover element 3 is formed by a part or by the entire shell surface of the tube, for example.

Figure 2I:
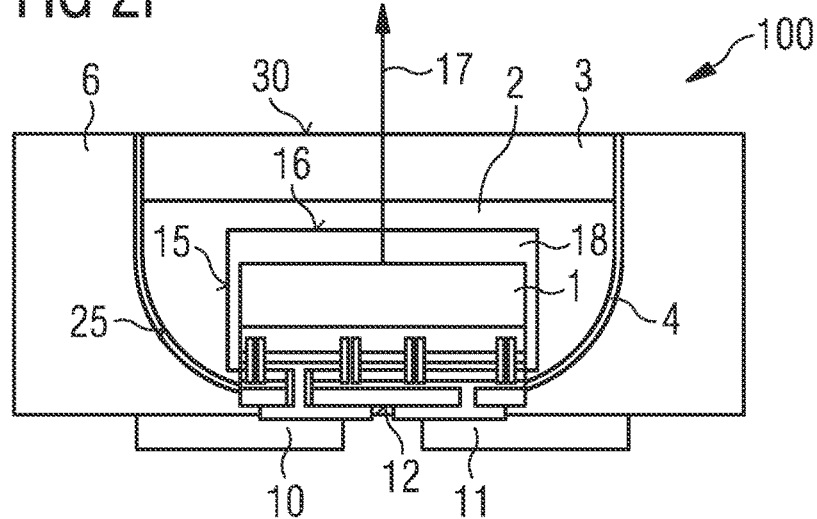

FIG. 2I shows an example of a light-emitting diode 100 in which the solid body 2 is completely and in a form-fit manner enclosed by a housing body 6. The housing body 6 terminates flush with the cover element 3 in the vertical direction on the radiation exit surface 30. The housing body 6 is formed from a white plastic material, for example. On a lower side of the light-emitting diode 100 located opposite the radiation exit surface 30, the first contact element 10 and the second contact element 11 are guided laterally on the housing body 6 and rest on it. The contact elements 10, 11 are freely accessible on the lower side.

Figure 2J:
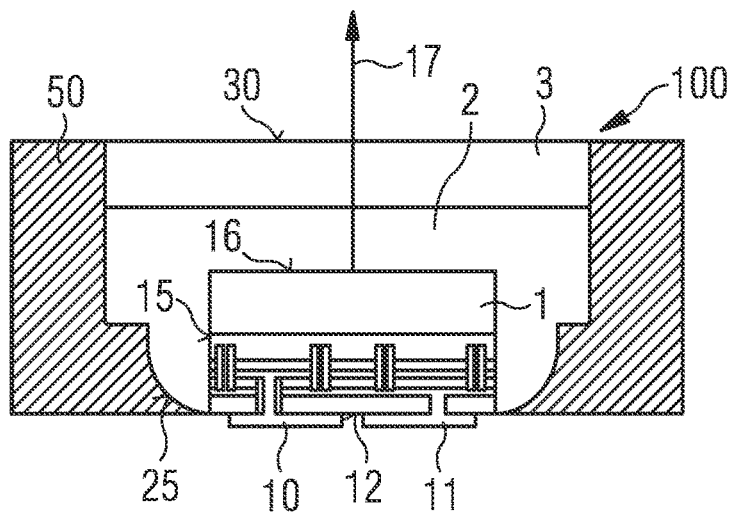

FIG. 2J shows an alternative example of the light-emitting diode. Alternatively to the example shown in FIG. 2A, the side of the mirror layer 4 facing away from the molded body 2 can be enclosed by another molded body 50. In particular, the further molded body 50 can replace the mirror layer 4. For example, the further molded body 50 comprises reflecting particles, in particular titanium oxide (TiO$_2$) particles, which are reflective for the electromagnetic radiation generated during operation of the semiconductor chip 1. The further molded body 50 can cover the shell surface of the molded body and the side surface of the cover element running transversely to the radiation exit surface 30, for example.

Figure 3A:
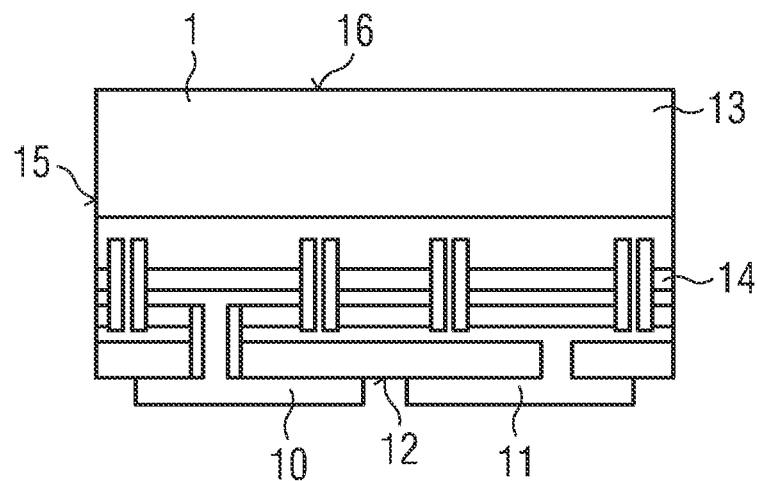
FIGS. 3A and 3B show optoelectronic semiconductor chips for light-emitting diodes in a lateral cross-sectional view.
Figure 3B:
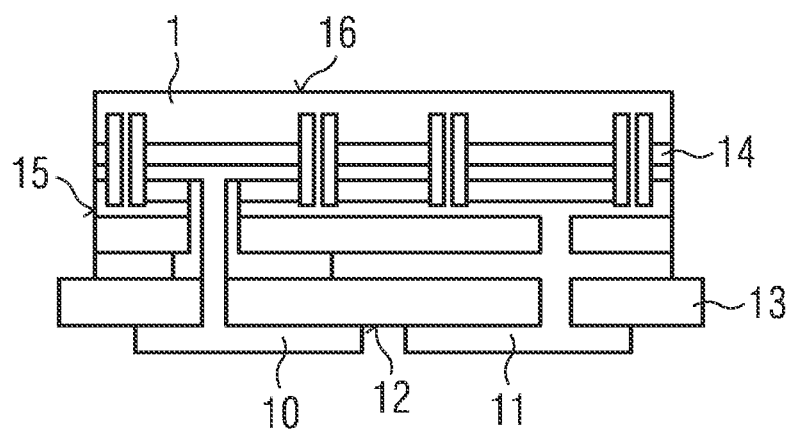

FIGS. 3A and 3B show lateral cross-sectional views of two different semiconductor chips 1. In this case, for example, such semiconductor chips are concerned, which are processed in the light-emitting diode 100 described above.

In FIG. 3A, the semiconductor chip 1 comprises a semiconductor layer sequence 14 having a growth substrate 13 arranged thereon for the semiconductor layers 14. The radiation side 16 is formed by the growth substrate 13, i.e. the semiconductor layer sequence 14 is located between the growth substrate 13 and the contact side 12. The semiconductor chip 1 of FIG. 3A is a so-called volume emitter, for example, in which radiation is in part also emitted from the semiconductor chip 1 through side surfaces of the growth substrate 13.

FIG. 3B shows a so-called thin-film semiconductor chip 1 in which the growth substrate described in conjunction with FIG. 3A is partially or completely removed. However, the semiconductor chip 1 comprises an auxiliary carrier 13 that is different from the growth substrate and serves the mechanical stabilization of the semiconductor layer sequence 14. In this case, the auxiliary carrier 13 is e.g. based on a semiconductor material or a metal and is formed between the semiconductor layer sequence 14 and the contact side 12. In this case, the radiation side 16 borders the semiconductor layer sequence 14.

My light-emitting diodes and methods are not limited to the examples by the description herein. This disclosure rather comprises any new feature as well as any combination of features, which in particular includes any combination of features in the appended claims, even if the feature or combination is not per se explicitly indicated in the claims or the examples.

This application claims priority of DE 10 2015 109 852.0 the subject matter of which is incorporated herein by reference.

The invention claimed is:

1. A method of producing a plurality of light-emitting diodes comprising:
   A) providing a carrier;
   B) applying a transparent potting material onto the carrier;
   C) providing a plurality of semiconductor chips, wherein each semiconductor chip comprises a radiation side, a contact side opposite the radiation side, and side surfaces extending transversely to the radiation side, wherein the semiconductor chips emit electromagnetic radiation through the radiation side along a main direction of emission extending perpendicular to the radiation side during operation,
   D) immersing the semiconductor chips with the radiation side face down so deeply into the potting material that the radiation side and the side surfaces are coated by the potting material in a form-fit manner, but the contact side still protrudes out of the potting material; and
   E) singulating the semiconductor chips along separating planes through the potting material and the carrier so that individual light-emitting diodes result, wherein
   every light-emitting diode comprises a solid body and a cover element,
   the cover element is each a part of the singulized carrier,
   the solid body is each a part of the singulized potting material, and
   the solid body becomes wider along the main direction of emission in each light-emitting diode.

2. The method according to claim 1, wherein the potting material is coated with a coating comprising a mirror layer having a reflectivity of at least 80% for the radiation emitted by the semiconductor chip.

3. The method according to claim 2, wherein
   the coating comprises a first passivation layer arranged between the solid body and the mirror layer,
   the first passivation layer has a thermal expansion coefficient over the entire area from −20° C. to +100° C., which lies between the thermal expansion coefficient of the solid body and the thermal expansion coefficient of the mirror layer, and
   the coating comprises a second passivation layer applied onto outer sides of the mirror layer.

4. The method according to claim 2, wherein
   the mirror layer is guided up to the contact side and electrically-conductively connects to a first contact element,
   a second contact element is attached to the contact side for external electrical contacting of the semiconductor body,
   the mirror layer electrically-conductively connects to the second contact element,
   the mirror layer is interrupted along a gap so that no short-circuit occurs between the first and the second contact element during operation, and
   the gap has a width of at most 10 μm.

5. The method according to claim 2, wherein
   a second contact element is attached to the contact side for external electrical contacting of the semiconductor body,
   the mirror layer is guided up to the contact side and electrically-conductively connected to the second contact element,
   the first contact element and the second contact element lie on top of one another so that in the region of the contact side, the second contact element is arranged between the semiconductor chip and the first contact element, and
   the first contact element forms a further mirror completely covering the semiconductor chip in a plan view of the contact side.

6. The method according to claim 2, wherein side surfaces of the cover element running transversely to a radiation exit surface and shell surfaces of the solid body are completely coated with the mirror layer.

7. The method according to claim 1, wherein
the solid body comprises or consists of one or more of plastic, silicone, clear silicone, silazane, acrylic, parylene, Omocer and glass, and
the solid body hermetically encapsulates the semiconductor chip.

8. The method according to claim 1, wherein a second contact element is attached to the contact side for external electrical contacting of the semiconductor body.

9. The method according to claim 1, wherein the cover element is a plate with two main sides essentially extending in parallel, and the main sides extend essentially parallel to the radiation side.

10. The method according to claim 1, wherein the cover element has a geometric shape of a lens, and a radiation exit surface is partially or completely concavely or convexly curved.

11. The method according to claim 1, wherein
the cover element is a tube filled with quantum dots,
the quantum dots cause a conversion of the electromagnetic radiation emitted by the semiconductor chip, and
a longitudinal axis of the tube extends essentially parallel to the radiation side.

12. The method according to claim 1, wherein at least one of
the semiconductor chips comprises a semiconductor layer sequence and a converter element arranged thereon,
the converter element forms at least the radiation side, and
the converter element comprises quantum dots.

13. The method according to claim 1, wherein lateral dimensions of the light-emitting diodes parallel to the radiation side are at least 300 μm larger than lateral dimensions of the semiconductor chips.

14. The method according to claim 1, wherein
the potting material has a viscosity of at most $10^5$ Pa·s upon immersion of the semiconductor chips, and
the potting material changes its shape in the area of the semiconductor chips due to surface tensions such that during a subsequent curing process the widening shape of the later solid bodies is formed.

15. The method according to claim 1, wherein after step D) a mirror layer is deposited onto the potting material from a side facing away from the carrier.

16. The method according to claim 15, wherein
a sacrificial layer is applied at least onto the contact side before depositing the mirror layer so that the sacrificial layer partially or completely covers the contact side, and
the sacrificial layer is removed after depositing the mirror layer so that the areas previously covered by the sacrificial layer are free from the mirror layer.

17. A light-emitting diode comprising:
an optoelectronic semiconductor chip with a first contact element, a radiation side, a contact side located opposite the radiation side, and side surfaces extending transversely to the radiation side, wherein the first contact element is attached to the contact side for the external electrical contacting of the semiconductor chip,
a transparent solid body,
a cover element, wherein
the semiconductor chip emits electromagnetic radiation through the radiation side along a main direction of emission running transversely to the radiation side during operation,
the semiconductor chip is embedded in the solid body, wherein the side surfaces and the radiation side are covered by the solid body in a form-fit manner,
the solid body widens along the main direction of emission,
the cover element is arranged downstream of the solid body in the main direction of emission and is applied directly onto the solid body,
a side of the cover element facing away from the solid body is formed as a radiation exit surface of the light-emitting diode,
the first contact element is exposed in the unmounted and/or non-contacted state of the light-emitting diode, and
the solid body comprises one or multiple shell surfaces extending transversely to the radiation side,
a mirror layer coated on the shell surfaces, and
a first passivation layer arranged between the solid body and the mirror layer, the first passivation layer having a thermal expansion coefficient over an entire area of −20° C. to +100° C., which lies between a thermal expansion coefficient of the solid body and a thermal expansion coefficient of the mirror layer.

* * * * *